United States Patent [19]

Nelson

[11] Patent Number: 4,937,453
[45] Date of Patent: Jun. 26, 1990

[54] X-RAY DETECTOR FOR RADIOGRAPHIC IMAGING

[76] Inventor: Robert S. Nelson, 25511 El Conejo La., Laguna Hills, Calif. 92653

[21] Appl. No.: 47,028

[22] Filed: May 6, 1987

[51] Int. Cl.$^5$ .............................. G01T 1/24
[52] U.S. Cl. .................. 250/370.09; 250/327.2; 250/370.10; 250/484.1; 378/146
[58] Field of Search ............... 378/19, 146, 174; 250/36 C, 370 G, 327.2, 484.1, 370.10, 370.09

[56] References Cited

U.S. PATENT DOCUMENTS

| | | | |
|---|---|---|---|
| 4,247,774 | 1/1981 | Brooks | 378/19 |
| 4,303,860 | 12/1981 | Bjorkholm et al. | 250/366 |
| 4,356,398 | 10/1982 | Komaki et al. | 250/486.1 |
| 4,394,737 | 7/1983 | Komaki et al. | 378/174 |
| 4,472,728 | 9/1984 | Grant et al. | 250/367 |
| 4,527,183 | 7/1985 | Anthony et al. | 250/370.13 |
| 4,661,704 | 4/1987 | de Leeuw et al. | 250/484.1 |
| 4,709,382 | 11/1987 | Sones | 378/19 |
| 4,737,641 | 4/1988 | Lange et al. | 250/484.1 B |

FOREIGN PATENT DOCUMENTS 144576 11/1980 Japan .................. 250/370.01
262100 12/1985 Japan .................. 250/327.2

OTHER PUBLICATIONS

James R. Janesick et al., The Future Scientific CCD, SPIE, vol. 501—State-of-the-Art Imaging Arrays & Their Applications (1984).

Primary Examiner—Carolyn E. Fields
Attorney, Agent, or Firm—Lyon & Lyon

[57] ABSTRACT

A method and apparatus for detecting x-ray radiation in a radiographic imaging context is disclosed. It is particularly useful in conjunction with slit and slot scan radiography. In accordance with this invention, detectors are constructed and arranged such that substantially all of the energy from an x-ray to be detected is discharged in the detector. In this way a detector is provided which provides a direct electronic read out, high x-ray stopping power and high spatial resolution while obtaining good signal collection efficiency without the use of excessively high voltage levels. In the preferred embodiment, solid state x-ray detectors are constructed such that the thickness of the detector along the direction of incident x-rays is long enough that substantially all of the x-ray energy is discharged in the detector.

12 Claims, 4 Drawing Sheets

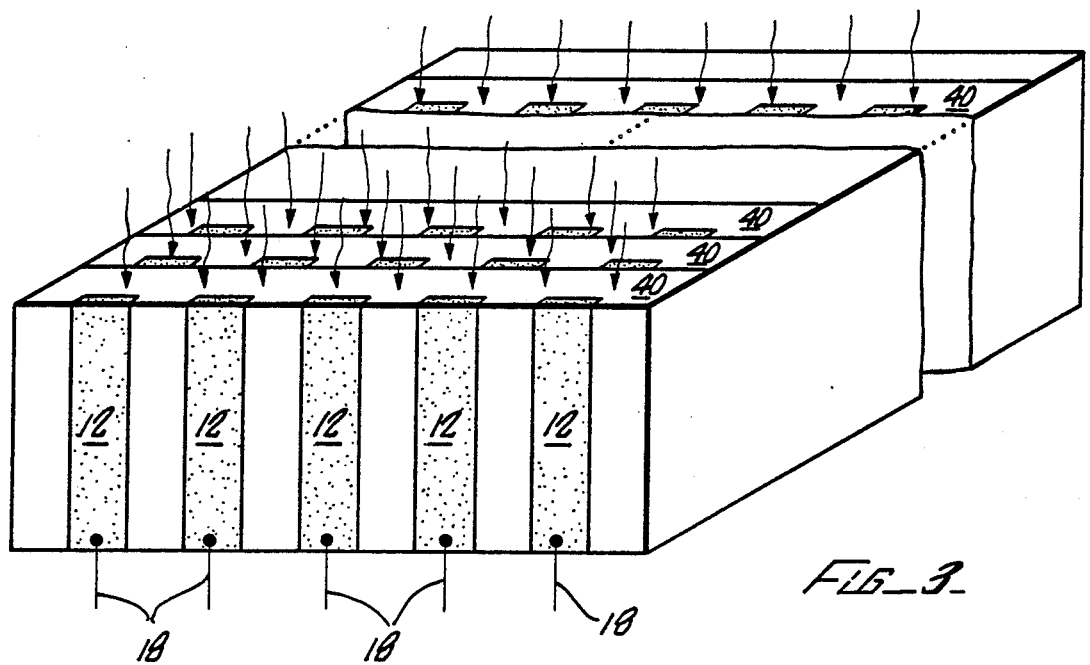
FIG_3.
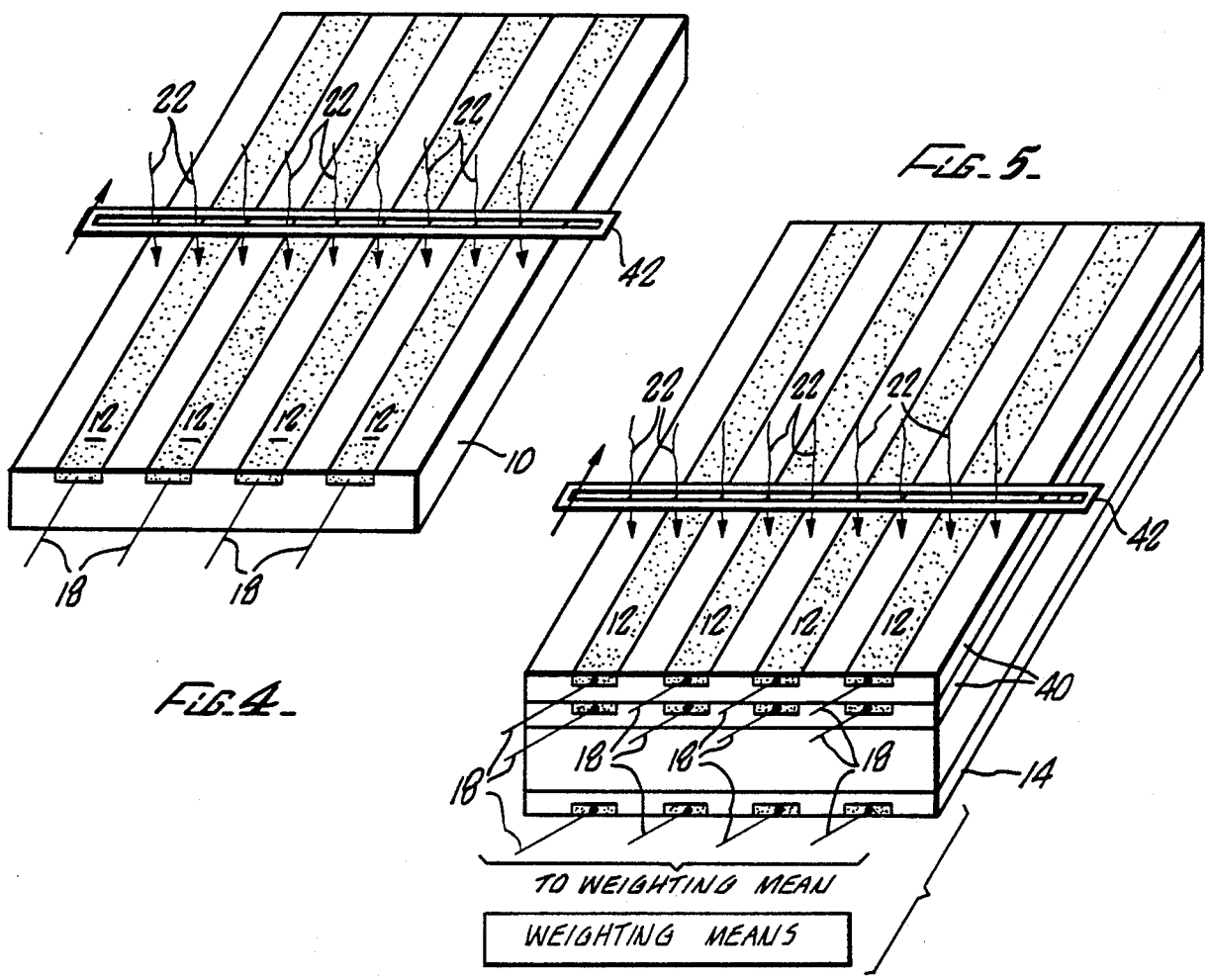
FIG_4.
FIG_5.
TO WEIGHTING MEAN
WEIGHTING MEANS

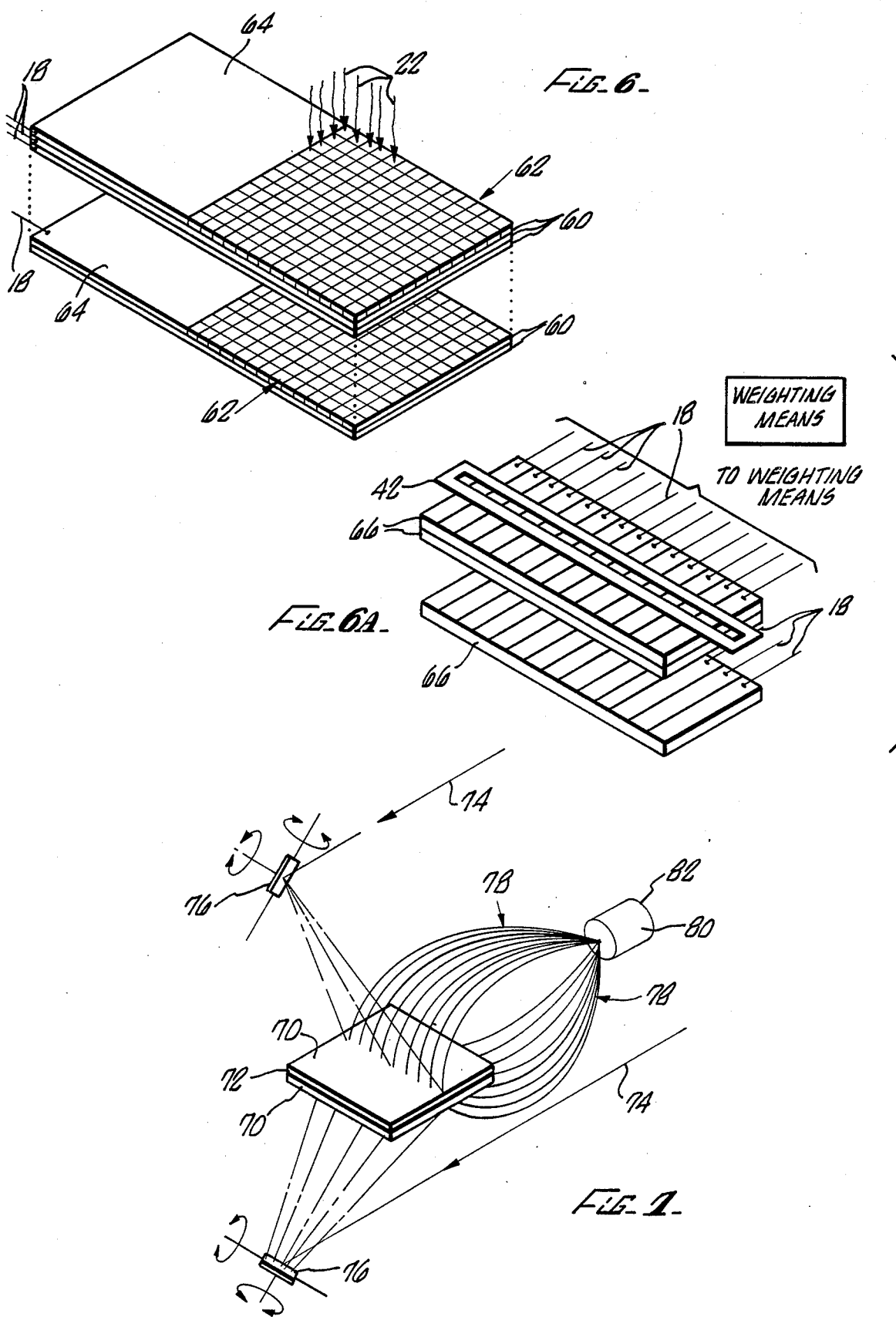

X-RAY DETECTOR FOR RADIOGRAPHIC IMAGING

This invention relates to improved x-ray detectors for radiographic imaging, and more specifically to such detectors for use in conjunction with slit and slot scan systems.

BACKGROUND OF THE INVENTION

The use of x-rays for radiographic imaging is well known. Radiographic imaging, at least in crude form, has been known since approximately the time of discovery of x-rays. In its simplest form, imaging is conducted by providing a source of x-ray radiation, an object to be imaged through which the x-ray radiation is transmitted, and a detector which serves to detect and record the transmitted radiation. The most common and simplest form of detector is x-ray sensitive photographic film. In a conventional set-up, radiation is transmitted through the object to be imaged and then is detected by a substantially two dimensional plane of x-ray sensitive film. Radiation is incident upon the film in a substantially perpendicular direction to the plane of film. Typically, such x-ray sensitive film is thin compared to the x-ray stopping distance of the film. Such film detection, as well as most of the x-ray receptors currently available for radiographic imaging, offer poor performance with respect to x-ray stopping power, signal collection efficiency, and read out efficiency, that is the number of read out elements needed to achieve suitable detection. For example, x-ray fluorescent phosphorus screens which are used with film are limited in thickness in order to avoid excessive optical selfattenuation and loss of spatial resolution.

Though this self-attenuation problem may be overcome, see for example, U.S. Pat. No. 4,560,882 to R. Nelson, Z. Barbaric entitled High Efficiency X-Radiation Converters, problems still remain. Several energy conversion stages are required such as x-ray-to-optical-to electronic signal, which may prove inefficient. If film is the optical sensor, then the film must be optically scanned if a digital image is desired.

X-ray detectors which directly provide an electrical output signal, thereby eliminating the need to optically scan an intermediate image such as on a film or sense the fluorescent signal with a photodetector, have proved difficult to implement in practice. Solid state x-ray detectors have been constructed from materials such as amorphous selenium, U. Schiebel, et al., Proceedings of the Society of Photo-Optical Instrumentation Engineers, 626:176, 1986, CdTe,Ge,$HgI_2$, PbO, GaAs, and Si, Y. Naruse, et al., IEEE Transactions in Nuclear Science, Volume NS28, No. 1:47, 1981, D. Miller, et al., IEEE Transactions in Nuclear Science, Volume NS-26, No. 1:603, 1979. Such materials have proved to be difficult to manufacture into plates or linear or two dimensional arrays with adequate thickness. Problems arise due to manufacturing imperfections. Additionally, possibly very high voltages are needed for a large thickness of material.

Improvements have been made upon the basic fluorescent phosphorus screen detectors. One such improved detector is a laser scanned storage phosphor detector, as shown for example in M. Sonoda, et al., Radiology, Volume 148:833, 1983. Such detectors operate by placing the phosphor in a metastable state upon detection of an x-ray, which is subsequently detected by scanning the phosphor with a laser beam which causes excitation of the phosphor from the metastable state to a higher energy state followed by subsequent de-excitation to a ground state. While such laser scanned storage phosphor systems provide a direct electronic read out, they suffer the same limitation experienced by x-ray phosphor screens, that being optical selfattenuation with increasing thickness.

Yet further problems arise in conjunction with electronic read out systems. While it is desirable to provide a direct electronic read out from a detector, it may be difficult to make a large two dimensional detector with high resolution and high stopping power for x-rays since many read out elements may be required. The use of many read out elements translates into a large number of interconnections, which result in the typical manufacturing and reliability problems experienced in such systems.

SUMMARY OF THE INVENTION

In accordance with the present invention, an x-ray detector is provided in which substantially all of the x-ray energy is detected. This invention is particularly well adapted to use in point, slit and slot scan radiation detection. In point or slit scanning the location of detected radiation is defined along one dimension by the slit. In such systems possible variables such as the energy of the detected radiation or the angle of incidence of the detected radiation are typically not of consequence. The primary goal of this invention is the maximization of detected radiation.

In the preferred embodiment, solid state strip detectors are used. Such detectors are composed of, for example, silicon crystal in which a plurality of parallel, elongated strips are deposited on one surface of the semiconductor. Passage of the x-ray through the semiconductor generates electrical particles which are collected and result in an output signal. In the preferred embodiment of this invention, the x-rays to be detected are incident upon the semiconductor in a direction parallel to the longitudinally extending strips. In this way the detector can easily be made long enough to cause the detected x-ray to lose substantially all of its energy in the detector.

In another embodiment of the invention, a plurality of strip detectors may be arranged in a stacked configuration with one similar detector placed on top of another. By stacking many strip detectors together the resultant detector thickness can be made large enough such that substantially all of the incident x-ray radiation is discharged in the detector. In this configuration, x-rays are incident upon the strip detector generally perpendicular to the face of the semiconductor bearing the longitudinally extending aluminum strips. A composite electrical output signal is generated by electrically summing all of the output signals for each of the strip detectors in series.

Thus, a principal objective of the present invention is to provide an x-ray detector in which substantially all of the energy from the detected x-ray is discharged in the detector.

Another object of the present invention is to provide a detector with increased x-ray stopping power.

A further objective of this invention is to reduce the complexity of the read out circuitry necessary.

A still further objective of this invention is to provide a detector with high spacial resolution imaging capabilities.

Yet a further objective of this invention is to obtain good signal collection efficiency while avoiding excessively high voltage levels.

These and other objects and advantages of the present invention will become more clear upon reference to the accompanying drawings and the following description.

BRIEF DESCRIPTION OF THE DRAWINGS

FIG. 3 is a perspective view of multiple semiconductor strip detectors combined to form a two dimensional detector for slot scan or multiple strip scan imaging.

FIG. 4 is a perspective view of a strip detector or drift chamber detector for slit scanning showing the x-ray slit collimator. In this arrangement the detector remains stationary with respect to the object being scanned.

FIG. 5 is a perspective view of a stack of aligned strip detectors for slit scanning showing the x-ray slit collimator.

FIG. 6 is a perspective view of a stack of aligned two dimensional detectors.

FIG. 6a shows a perspective view of a stack of aligned one dimensional detector arrays.

FIG. 7 is a perspective view of a stacked storage phosphor plate system with divided laser beam read out.

DETAILED DESCRIPTION OF THE PREFERRED EMBODIMENTS

This invention relates to a method and apparatus for detecting x-ray radiation in a radiographic imaging context. It is particularly useful in conjunction with slit and slot scan radiography. In accordance with this invention, detectors are constructed and arranged such that substantially all of the energy from an x-ray to be detected is discharged in the detector. In this way a detector is provided which provides a direct electronic read out, high x-ray stopping power and high spatial resolution while obtaining good signal collection efficiency without the use of excessively high voltage levels.

Figure 1:
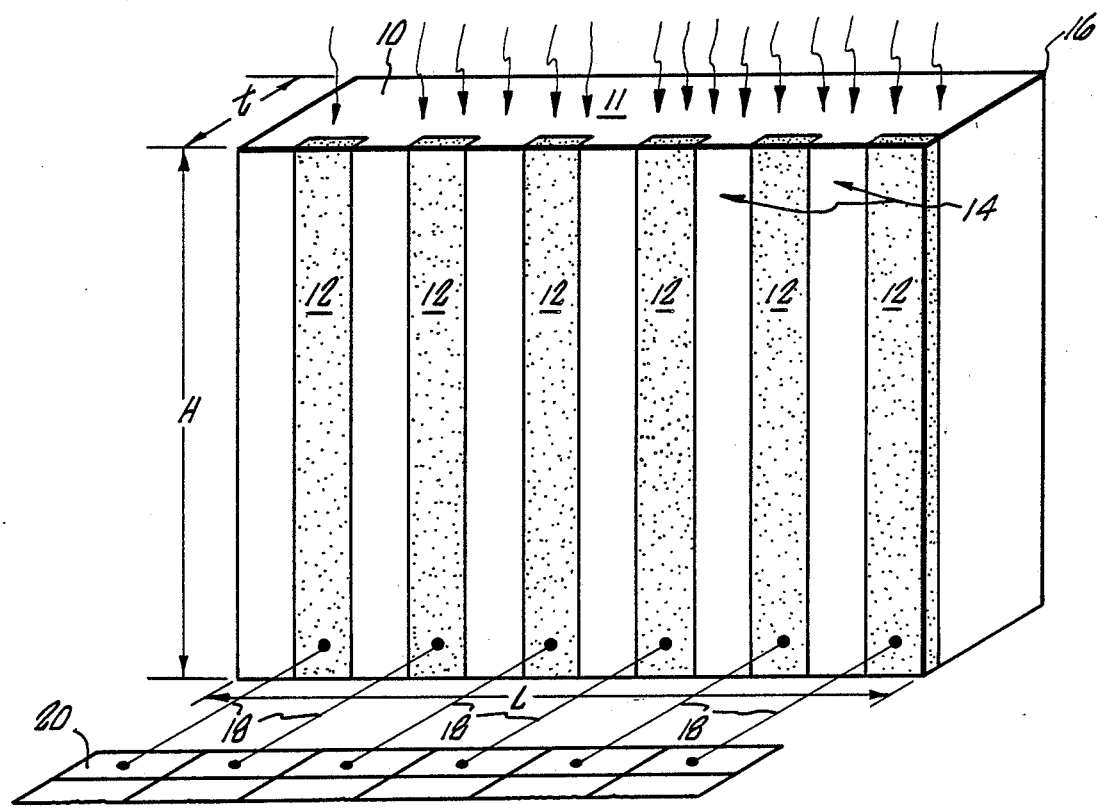
FIG. 1 shows a perspective view of a solid state strip detector used as a linear array in which x-rays are incident upon the edge. In a slit or slot scan format the detector will move with the scanning slit or slot, not shown.

FIG. 1 shows a conventional silicon type strip detector for use as an x-ray detector. In one embodiment, the semiconductor detection material 10 is an N-type silicon crystal. A plurality of substantially parallel elongated aluminum strips 12 are deposited on one surface of the silicon substrate 10. The aluminum strips 12 are used for charge collection purposes. The other face of the silicon substrate 10 has an aluminum contact 16 deposited on it. A P-plus implantation is located under the aluminum strips 12, and an N-plus implantation is provided beneath the aluminum contact 16. Electrical connections 18 are provided from the aluminum strips 12 to an amplifier 20. The amplifier 20 is preferably composed of a charge coupled device (CCD) or charge injection device (CID) which can store charge before readout.

The detector will have a thickness T, a height H and a length L. The thickness T is typically much less than the height H or the length L, and is also typically less than the x-ray stopping distance in the detector material 10. In operation, collimated x-rays 22 will be incident upon the face 11 of the semiconductor material 10. The detector is oriented such that the incident collimated x-rays 22 are substantially perpendicular to the detector face 11 such that the incident x-rays proceed down through the detector. The detector height H is chosen such that substantially all of the energy of the incident collimated x-rays 22 is discharged while passing through that length of detector material. In this way the x-ray stopping power of the detector is increased.

As the collimated x-ray 22 passes through the semiconductor material 10 in a direction along the height H, energy is dissipated by the x-ray and charged particles are generated. An electric field exists within the semiconductor material 10 such that the charged particles generate a signal at the aluminum strips 12. The resultant signal is transferred by an electrical connection 18 to an amplifier 20 which uses, for example, a CCD or CID. The resultant signal may then be analyzed or digitized.

Solid state detectors of the type shown in FIG. 1 are currently used in various applications, for example, in high energy physics photon and particle detector applications. See, e.g., P. Rehak, et al., Nuclear Instruments and Methods in Physics Research, A235 (1985) 224–234; R. Klanner, Nuclear Instruments and Method in Physics Research, A235 (1985) 209–215; P. Manfredi, et al. Nuclear Instruments and Methods in Physics Research, A235 (1985) 345–354; and J. Kemmer, et al., IEEE Transactions on Nuclear Science, Vol. NS-29, No. 1, 733–737 (1982). However, in such applications the radiation is incident on the large face of height H and length L. In such applications the location in two dimensions and energy of the incident photon or particle is of interest. In contrast, in the detector of the instant invention the location of the x-ray along one dimension has been defined by the slit or thickness T of the detector. Additionally, in most high energy physics applications it is not necessarily the goal to cause the photon or particle to discharge all of its energy in a given detector. New particles or photons resulting from an interaction may be detected downstream. In contrast, the detector of this invention is intended to be oriented and to be of such a size that substantially all of the energy of the incident collimated x-rays 22 is discharged within the detector.

Figure 2:
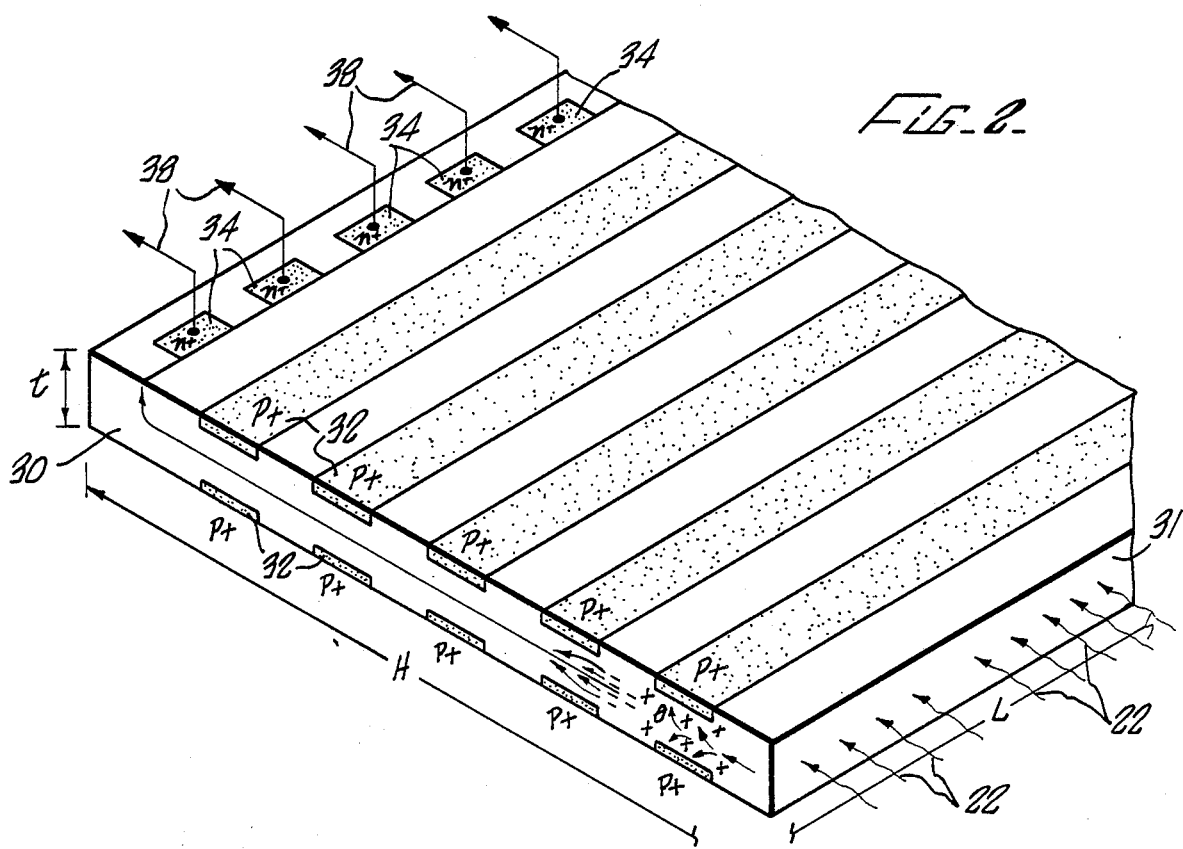
FIG. 2 is a perspective view of a semiconductor detector of the drift chamber type used as a linear array in which x-rays are incident upon the edge.

FIG. 2 shows a semiconductor drift chamber of the type which may also be found in detectors for high energy physics applications. The drift chamber is composed of a semiconductor material 30, typically silicon, of thickness T, height H and length L. The thickness T is typically substantially less than the height H and the length L and is also typically substantially less than the typical x-ray stopping distance in the semiconductor material 30. A plurality of plus regions 32 are diffused in a substantially parallel elongated manner into both of the faces of dimension H by L of the semiconductor material 30. Segmented end nodes 34 are composed of plus diffusions and are diffused into the face of the semiconductor material 30. Leading from the segmented anode 34 are a plurality of electrical connections 38 which go to amplifiers and signal analyzing equipment.

In operation collimated x-rays 22 are incident on the face 31 of thickness T and length L. The incident x-rays progress through the semiconductor material 30 in a direction generally parallel to the height axis. The x-ray 22 generates electrical charges within the semiconductor material 32 which then are collected by the various plus regions 32 and generate an output signal at the segmented anode 34. By orienting the semiconductor drift chamber in this manner substantially all of the energy in the incident x-ray 22 can be discharge within the detector. A number of collecting electrodes 32 may be connected along the height H of the detector to provide spatial resolution. Typically, such semiconductor drift chambers are capable of lower noise read out than are strip detectors.

Spatial resolution along the thickness direction T may be controlled in strip detectors of the type shown in FIG. 1 or drift chambers of the type shown in FIG. 2 preferably for x-ray slit and slot scanning applications by either varying the width of the slit of the x-ray collimator, by varying the thickness T of the detector, or by varying the signal integration period during a scan. Spatial resolution along the length direction L in strip detectors as shown in FIG. 1 may be varied by increasing or decreasing the number of readout strips or collection electrodes.

Because the x-ray radiation 22 is incident along the long direction of the semiconductor material there is an apparent increase in detector attenuation thickness from thickness T to height H with no change in the necessary applied voltage. A single strip detector or semiconductor drift chamber detector is acceptable for slit or slot scan imaging devices for radiographic purposes Although read out can be achieved by using individual amplifiers connected to each strip or collecting electrode, it will generally be more economical to employ charge accumulating circuitry implemented with LSI methods. See, e.g., R. Klanner, Nuclear Instruments and Methods in Physics Research, A235:209, 1985 and K. Kempter, Proceedings of the Society of Photo-Optical Instrumentation Engineers, 617:120, 1986. A CID or CCD read out may be utilized. This integrated charge may then be converted into a digital signal by known methods.

A two dimensional radiation detector useful for slot scanning may be constructed by combining a number of strip detectors or semiconductor drift chamber detectors. FIG. 3 shows an arrangement of multiple strip detectors combined so as to form a two dimensional detector for slot scan imaging. As shown, each of the strip detectors 40 is arranged adjacent to the next strip detector such that the respective electrical contact areas 12 are aligned. The combination of detectors is oriented relative to the collimated x-rays 22 in the same orientation as for a single strip detector as shown, for example, in FIG. 1. Small air gaps or thin insulator materials may be used to separate adjacent strip detectors 40. If small dead spaces are unacceptable, the individual detector arrays may be spaced sufficiently far apart such that unexposed regions of the subject corresponding to the gaps are exposed when the detector is stepped or moved forward to acquire a new set of image slices. In this way the simple slot design has been effectively divided into an array of slits.

Faster scanning speeds may be attained if detector read out includes time delay integration (TDI). TDI serves to integrate the charge collected from each element in a column as the array of detectors passes through the same point along the direction of scan. TDI scanning techniques have been employed in applications such as x-ray slot scanning, J. de Groot, et al., Proceedings of the Society of Photo-Optical Instrumentation Engineers, 591:24, 1985, and aerial photography, R. Wight, Proceedings of the Society of Photo-Optical Instrumentation Engineers, 591:102, 1985. The efficiency of x-ray tube utilization improves according to the number of detector arrays employed. However, the read out rate must be closely matched to the scanning speed and the apparent detector element width along the direction of scan.

The strip or drift chamber imaging technique of this invention can be utilized for slit scanning applications in which the detector remains stationary. As shown in FIG. 4 a strip detector for slit scanning is shown along with an x-ray slit collimator 42 shown overlying the detector. The x-ray slit collimator 42 moves along the surface of the detector. The spatial resolution in the direction of the scan is dependent on the slit width and the integration time of the read out mechanism. Charge is sensed at the end of the detector strip 12 (or collecting electrode if a semiconductor drift chamber is used). The slit scan speed will be limited by x-ray tube output capacity, the read out integration period and detector lag time. The slit scan speed must not be so fast that substantial contributions to the read out signals are provided from previously irradiated regions. Any fall off of signal strength due to the x-ray slit position with respect to the read out mechanism can be compensated for via known techniques either interactively or during post processing of data. A number of detector blocks may be laid end to end to provide a continuous detector of desired length. In order to provide continuity of detector, the detector blocks may be displaced slightly with respect to the direction of incoming x-rays such that the ends of the adjacent detector blocks overlap. This would minimize abutment problems.

The detection efficiency or stopping power of a solid state strip detector, solid state drift chamber detector, or any two dimensional detector or combinations thereof may be increased. As shown in FIG. 5 the individual detectors may be stacked such that corresponding detector elements or strips are aligned so as to increase detection efficiency. A plurality of strip detectors 40 are aligned in a stacked fashion such that the corresponding sensor elements in two or more stack detectors can have their signals combined before final read out. The outputs 18 may be combined in a variety of ways. It is desirable to position detectors in the stack as closely as possible together, thereby approximating one continuous detector. It may be advantageous to sum the charges from all the corresponding elements before the total charge is amplified and digitized. Alternatively, the signals may be digitized separately and then summed. The latter approach permits an energy spectrum to be computed which is useful in, for example, dual energy applications. The latter approach also permits signals originating deeper in the detector stack to be weighted so as to more appropriately represent the image contrast information carried by higher energy x-rays. Clearly different detector materials and filters can be used in the stack to enhance the accessible information within the x-ray energy spectrum.

FIG. 6 shows a stack of aligned two dimensional detector arrays. The detector arrays 62 are composed of CCD's or CID's. The outputs from each of these detectors 62 is output via electrical connection 18 and may be summed to provide an ultimate read out signal. The stack arrangement may be suitable for slot scan applications.

FIG. 6a shows a one dimensional version of the detector shown in FIG. 6. In the stack of one dimensional detectors the position of the stack of strip detectors is fixed with respect to the slit collimator. The number of strip detectors comprising the stack may be reduced by increasing the apparent thickness of a detector from T to $T/\cos(\theta)$ by tilting the detectors by an angle $\theta$ ($\theta$ measured from the horizontal).

Fluorescent or storage phosphorus screens may be coupled to strip detectors or drift chamber detectors or any two dimensional array detectors which are optically sensitive. As discussed in the Background section, above, fluorescent and storage phosphorus screens are known to the art. Incident x-ray radiation upon a storage phosphorus screen causes the phosphor to be placed in a metastable state. After the imaging is completed, the phosphor is excited to a higher energy state, as for example by a laser, at which time the now excited phosphor de-excites to its lower energy state and emits a photon which may be detected. In accordance with the instant invention two such fluorescent phosphorus screens may be coupled together so as to increase the resultant output signal. As shown in FIG. 7, two phosphor storage plates 70 are arranged with an intermediate optically opaque divider plate 72. Incident radiation will impinge upon the storage phosphor plate 70 in a generally perpendicular direction thereby also being incident upon the second storage phosphor plate 70 in almost the same physical location. Scanning is then achieved through use of, for example, a laser beam 74. In the preferred embodiment a single laser source may be used in which the beam is split into two components and then reflected off of identical scanning mirrors 76, one disposed on either side of the storage phosphor plate 70, such that identical corresponding locations of the storage phosphor plates 70 are scanned at the same time. The emitted photon from the now deexcited storage phosphor plate is coupled via a light guide 78 to a photomultiplier tube 80 which generates an output signal transferred via cable 82. Additional energy information can be obtained if the optically opaque divider also provides x-ray filtration. Readout would require a photomultiplier tube for each screen. Image contrast could be improved by compensating or weighting the signals acquired from the lower plate. This might be accomplished by using a separate readout photomultiplier tube for the lower screen or reducing the optical signal from the lower screen which reaches the photomultiplier tube, by, for example, using fibers of smaller numerical aperture, a variable diaphragm or an adjustable optical attenuator.

If only one storage phosphor plate is used, it may be made thicker and then scanned on both sides with two laser beams, in accordance with this invention.

An alternative configuration consists of sandwiching a solid state detector between the two storage phosphor plates 70. In this case the solid state material must be insensitive to the scanning laser beam wavelength or area illumination beam wavelength if a two dimensional detector array is used. For this detector configuration it often is easier to utilize fluorescent phosphorus screens and so acquire information during the scan. Then the solid state detector could consist of, for example, a back illuminated CCD, in which the gates of the CCD's are made out of an optically transparent material such as polysilicon, as is done in front illuminated CCD's, rather than to use an opaque material such as aluminum. See, e.g., J. Janesick, et al. Proceedings of the Society of Photo-Optical Instrumentation Engineers, 501:2, 1984, and D. Walton, et al., Proceedings of the Society of Photo-Optical Instrumentation Engineers, 501:306, 1984. Other suitable detectors known to those skilled in the art include charge injection devices and photodiode arrays. In this way a dual read out can be obtained with a single detector since the scintillator phosphor screen 70 can be applied to both sides of the back illuminated CCD. Thus, a stack consisting of two phosphor screens 70 can be read out with one solid state device. If desired, a number of back illuminated CCD's may be used in a stack arrangement as described previously.

Figure 8:
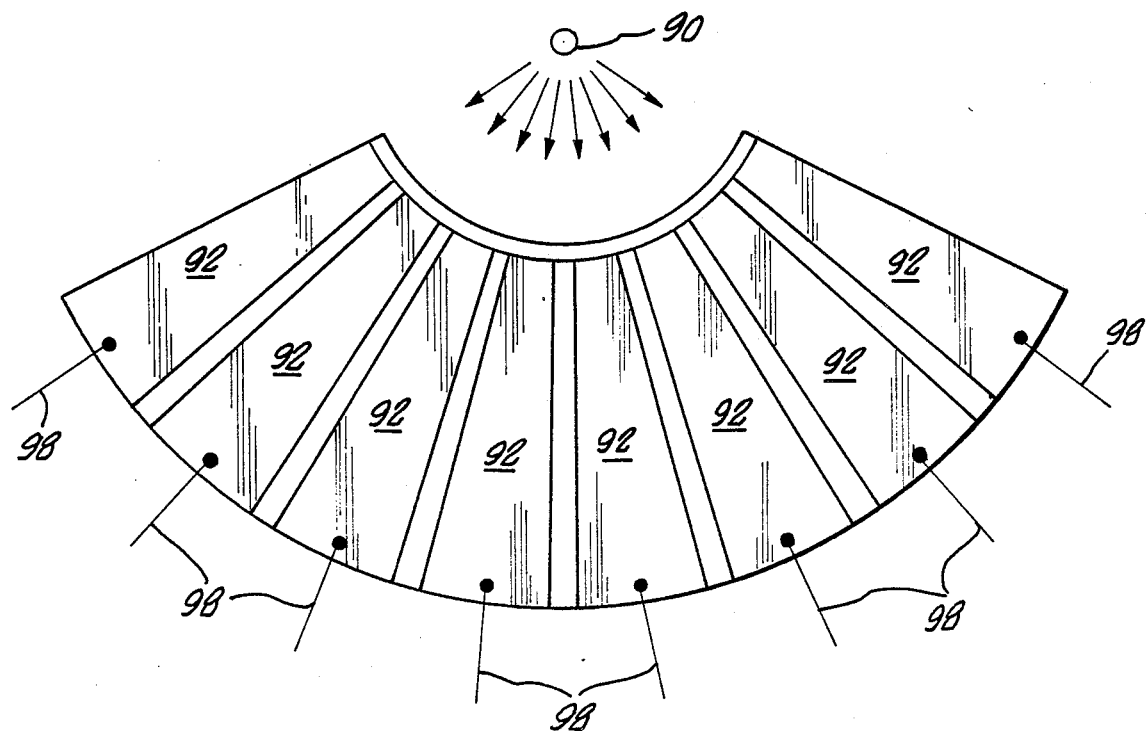
FIG. 8 is a perspective view of a fan shaped array of strip detectors for use with a localized or point radiation source.
Figure 8A:
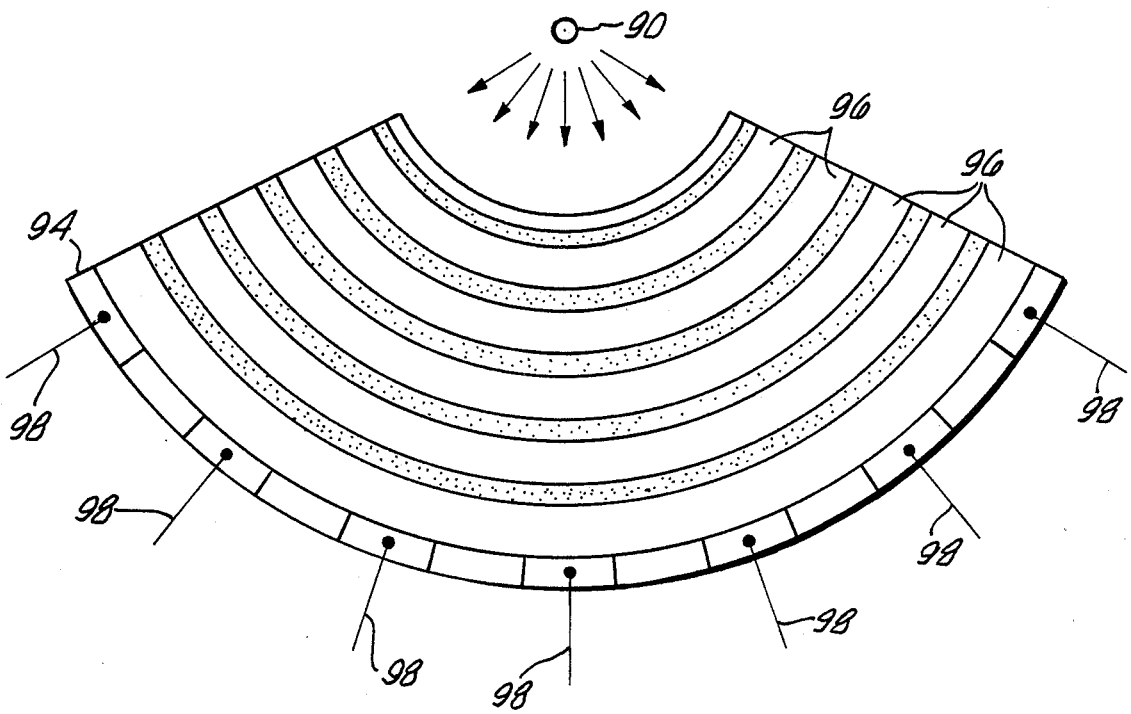
FIG. 8a is a perspective view of a drift chamber detector for use with a point source of radiation.

FIG. 8 and FIG. 8a show alternative configurations of strip detectors and electron drift chambers, respectively, for focal spot radiation or point source radiations. FIG. 8 shows a plurality of detectors 92 oriented to intercept radiation from a point source radiation 90. The resultant signal is read out via electrical connections 98. In FIG. 8a an electron drift chamber is shown in a configuration for a point radiation source in which the focused electrodes 96 and segmented anode 98 ar shown. Read out is accomplished via electrical connections 98. These configurations provide compensation for the variable magnification from center to edge which would be recorded by a planar detector. Energy dependent information could be acquired by dividing the detector unit into two or more annular shaped detectors. The detectors shown in FIG. 1 and FIG. 2 could similarly be divided.

It will be appreciated that it is possible to utilize detectors composed of a variety of solid state materials to generate a stack of detectors. In the case of a fluorescent phosphor detector different phosphor materials may be used or the filter materials placed between the members of the stack may vary in composition.

The technique of using a stack of detector plates to increase stopping power may also be used to diminished the effect of higher energy x-rays. Higher energy x-rays will be preferentially recorded by detector planes deeper in the stack since the beam spectrum hardens with increasing attenuation. Generally, the higher energy x-rays represent less contrast information than low energy x-rays, but generate greater signals when stopped by a detector. Thus, the signal output from deeper detectors can be preferentially diminished before being summed with the signals from other detector planes. With appropriate beam calibration, additional contrast enhancement may be obtained with a detector stack as opposed to a single detector.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method for obtaining improved radiographic images consisting of orienting a semiconductor radiation detector whose height along a direction of incident radiation is greater than its thickness such that substantially all of the energy of the radiation is dissipated within the detector.

2. A radiographic imaging apparatus comprising an x-ray source and a semiconductor x-ray detector for detecting incident x-ray radiation, wherein the semiconductor detector. is oriented relative to the incident radiation from the source such that substantially all of the energy from the incident radiation is dissipated within the detector and wherein the x-ray detector has a height along a direction of incident radiation which is greater than the thickness.

3. An apparatus for the detection of incident radiation for radiographic imaging comprising;
  x-ray detector means comprising a plurality of semiconductor x-ray strip or drift chamber detectors, said detector means being of sufficient height so as to cause the dissipation of substantially all of the incident radiation within said detector means.
  electrical outputs for each of the strip or drift chamber detectors, and
  electrical connection between each of the semiconductor x-ray strip or drift chamber detectors such that the output corresponding to corresponding points in each of the detector sis combined.

4. The apparatus of claim 3 wherein the plurality of strip or drift chamber detectors are arranged in a stack.

5. The apparatus of claim 4 wherein the detectors in the stack are larger the further they are from a source of radiation.

6. The apparatus of claim 4 wherein the detectors in the stack are two dimensional detectors comprising charge coupled devices.

7. The apparatus for the detection of incident radiation of claim 3 further comprising a scanning slit or slot.

8. The apparatus for the detecting of incident radiation of claim 7 wherein the semiconductor x-ray strip or drift chamber detectors remain stationary with respect to the object to be imaged and are not fixed relative to the scanning slot or slot.

9. The apparatus of claim 3 wherein the semiconductor x-ray strip or drift chamber detectors are arranged to compensate for the divergence of the incident radiation.

10. An x-ray detector for obtaining radiographic images in connection with slit and slot scan radiography, comprising:
  x-ray detector means comprising a plurality of semiconductor x-ray detectors of the drift chamber or strip detector type, or two dimensional detector arrays or charge coupled devices, said detector means being of sufficient height so as to cause the dissipation of substantially all of the incident radiation within said detectors, and
  electrical connections between each of the semi-conductor detectors and an output means.

11. The x-ray detector of claim 10 which further comprises filter materials located between the said detectors to modify the x-ray beam spectrum.

12. The detector of claim 10 wherein including means to weight the signal at the electrical connections.

* * * * *